United States Patent [19]

Lin et al.

[11] Patent Number: 5,802,573

[45] Date of Patent: Sep. 1, 1998

[54] METHOD AND SYSTEM FOR DETECTING THE ISSUANCE AND COMPLETION OF PROCESSOR INSTRUCTIONS

[75] Inventors: Zhongru Julia Lin; Nadeem Malik; Avijit Saha, all of Austin, Tex.

[73] Assignee: International Business Machines Corp., Armonk, N.Y.

[21] Appl. No.: 606,904

[22] Filed: Feb. 26, 1996

[51] Int. Cl.[6] .................................................. G06F 13/00
[52] U.S. Cl. ................................... 711/144; 395/500
[58] Field of Search ......................... 395/468, 471, 395/472, 182.03, 183.13, 183.18, 185.07, 500; 711/141, 144, 145; 371/27.4; 364/550, 551.01, 580, 578

[56] References Cited

U.S. PATENT DOCUMENTS

| | | |
|---|---|---|
| 4,789,925 | 12/1988 | Lahti . |
| 4,985,825 | 1/1991 | Webb, Jr. et al. . |
| 5,075,846 | 12/1991 | Reininger et al. . |
| 5,127,093 | 6/1992 | Moore, Jr. . |
| 5,251,308 | 10/1993 | Frank et al. . |
| 5,355,457 | 10/1994 | Shebanow et al. . |
| 5,355,471 | 10/1994 | Weight ............................. 395/182.08 |
| 5,406,504 | 4/1995 | Denisco et al. ...................... 364/580 |
| 5,546,579 | 8/1996 | Josten et al. ........................ 395/608 |

OTHER PUBLICATIONS

Saha et al.; A Simulation–Based Approach to Architectural Verification of Multiprocessor Systems; Computers and Communications, 1995 Int'l Phoenix Conf.; pp. 34–37, Mar. 1995.

Tanenbaum; Structured Computer Organization 2nd Ed.; pp. 10–12, 1984.

*Primary Examiner*—Parshotam S. Lall
*Assistant Examiner*—Kenneth R. Coulter
*Attorney, Agent, or Firm*—Richard A. Henkler

[57] ABSTRACT

A method and apparatus for verifying memory coherency of a simulated computer system. A verification logic unit is used for detecting the issuance of load and store instructions from the simulated system. Targets (registers or memory locations) representing the detected instructions are then stored in queues, and marked (colored) as not having been executed. After a detected instruction has been executed and completed, the corresponding target in the queue is marked as being completed. During every clock cycle of the apparatus, the verification logic unit monitors the queues for entries (Targets) marked as completed, which are then discarded.

9 Claims, 3 Drawing Sheets

METHOD AND SYSTEM FOR DETECTING THE ISSUANCE AND COMPLETION OF PROCESSOR INSTRUCTIONS

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

BACKGROUND

1. Field of the Present Invention

The present invention generally relates to data processing systems, and more specifically to methods and apparatuses used for detecting the issuance and completion of processor instructions.

2. History of Related Art

The consumer's appetite and demand for functionality and increased productivity has resulted in the expansion of the computer industry at an unprecedented rate. These demands often reach and exceed the outer limits of the current state of technology. Thus, producing a partnership, between the industry and the consumer, in which the industry is, essentially, forced to develop innovations to the many problems encountered from this expansion. One area of particular importance has been the testing and verification of system designs.

One problem encountered in this area is the testing of multi-processor systems. In particular, the ability to detect, during the simulation of a data processing system, the issuance as well as the completion of the simulated processor(s) instructions. This type of detection is beneficial for verifying memory coherency. Memory coherency, as used hereinafter, refers to the fact that all copies (e.g. cache copies) of a particular portion of memory are the same or current. Currently, very specific and detailed knowledge of the internal workings of the simulated processor(s) is required to accomplish the detection. This type of information is often unavailable or incomplete. Consequently, any method developed for such detection is processor specific and may be unreliable.

It would, therefore, be a distinct advantage to have a method and system for detecting, during the simulation of a data processing system, the issuance and completion of the simulated processor(s) instructions. Such a method and system would not be processor specific, and would not require a detailed knowledge of the internal workings of the simulated processor(s). The present invention provides such a method and system.

SUMMARY OF THE PRESENT INVENTION

In one aspect, the present invention is a method and apparatus for verifying memory coherency of a first data processing system being simulated by a second data processing system. The second data processing system detects memory altering instructions (e.g. load and store) issued by the simulated system. Each of these instructions has a target location (e.g. register or memory) for receiving data related thereto. Each of the target locations are initialized to equal a color value, which only changes upon the execution of the corresponding instruction.

BRIEF DESCRIPTION OF THE DRAWINGS

The present invention will be better understood and its numerous objects and advantages will become more apparent to those skilled in the art by reference to the following drawings, in conjunction with the accompanying specification, in which.

DETAILED DESCRIPTION OF THE PREFERRED EMBODIMENT OF THE PRESENT INVENTION

Figure 1:
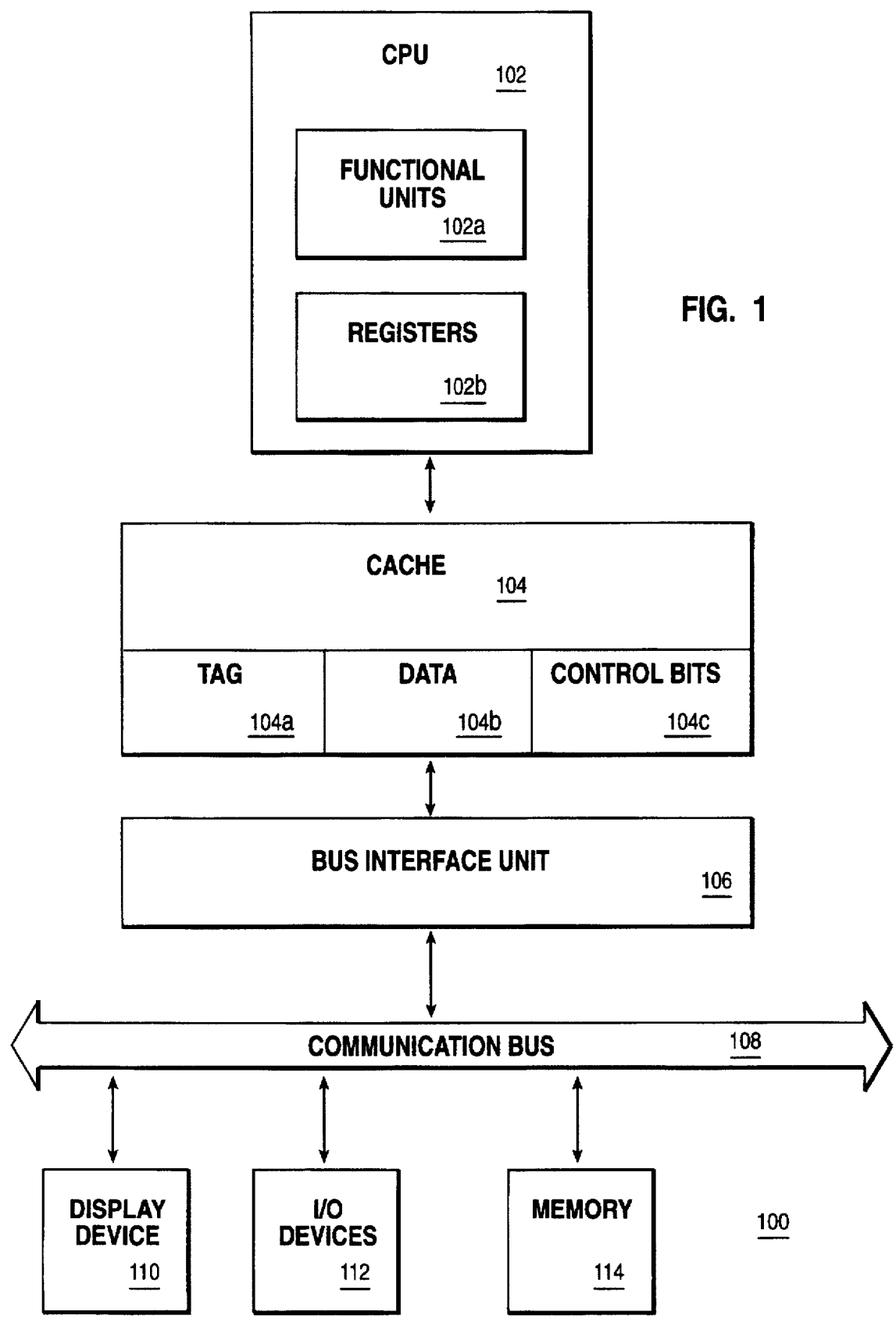
FIG. 1 is a block diagram of a Computer System in which the present invention can be practiced.

Reference now being made to FIG. 1, a block diagram of a computer system 100 in which the present invention can be practiced is shown. Computer system 100 includes a Central Processing Unit (CPU) 102, a Cache 104, a Bus Interface Unit (BIU) 106, a Display Device 110, I/O Devices 112, and Memory 114. The Display Device 110, I/O Devices 112, Memory 114, and BIU 106 are all interconnected to Communication Bus 108 which provides communication from and to one another. Many of the functions and designs of the Computer system 100 components are well known and understood by those of ordinary skill in the relevant art. Consequently, only a brief description of each of the components is deemed necessary.

CPU 102 includes Functional Units 102a and Registers 102b. Functional Units 102a includes all units which provide additional functionality to the CPU 102, such as the Arithmetic Logic Unit. Registers 102b represents the registers typically available in a CPU 102 for processing operations therein.

Cache 104 can be either a level one or two and may be either internal or external. In this particular embodiment, the Cache 104 is illustrated as being external. As illustrated in FIG. 1, each line of the Cache 104 includes a Tag field 104a, a Data field 104b, and Control bits field 104c. The Control bits field 104c includes bits for indicating whether the line is Modified, Exclusive, Shared, or Invalid (MESI). The BIU 106 is used for interfacing between the Cache 104 and the Communication Bus 108.

The Display device 110 is any device capable of displaying graphical information to a user of the Data Processing System 100. I/O Devices 112 represents typical devices used for providing communication to and from the Data Processing System 100, and may include, for example, a mouse, a keyboard, and an ethernet card. Memory 114 represents any typical memory means used in a data processing system.

Figure 2:
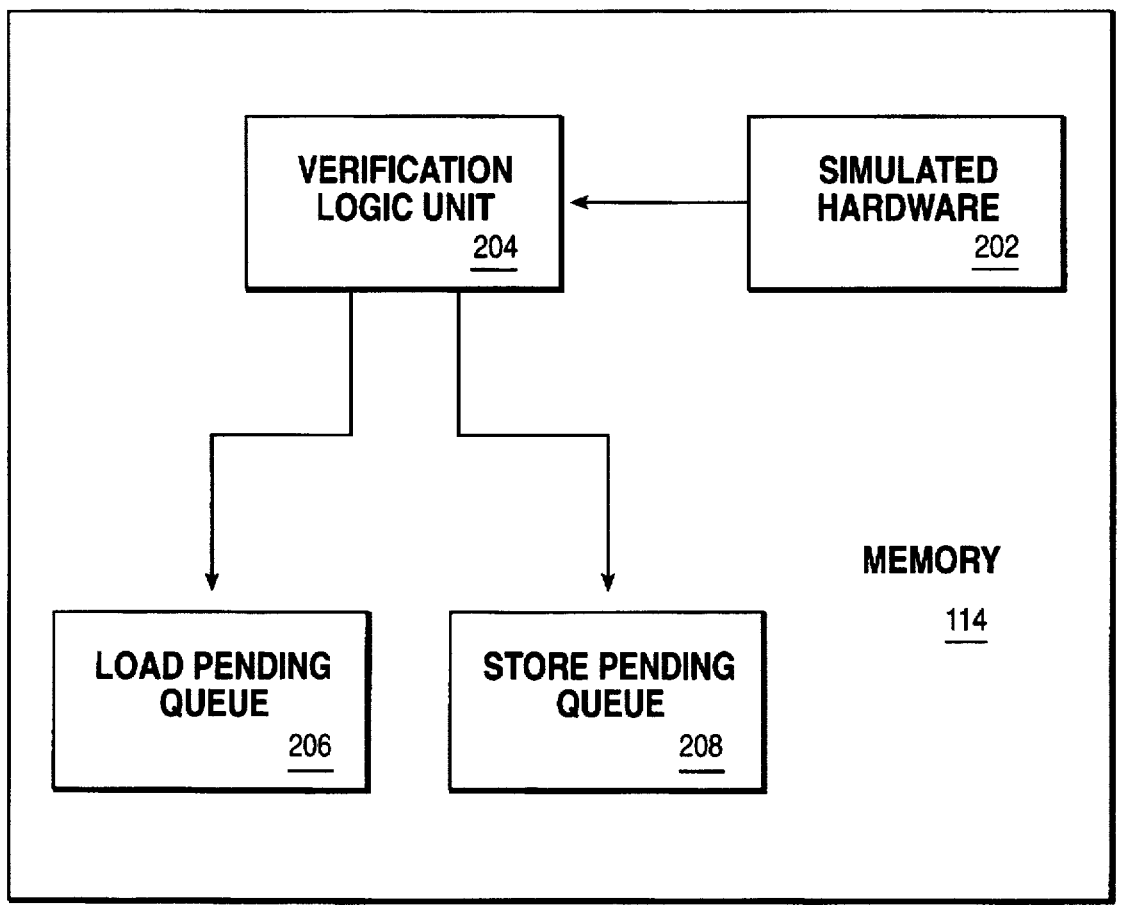
FIG. 2 is a block diagram illustrating the present invention as it resides within the Memory of FIG. 1.

Reference now being made to FIG. 2, a block diagram is shown illustrating the present invention as it resides within the Memory 114 of FIG. 1. The computer system to be simulated and verified for coherent memory access is designated as 202 and labeled "Simulated Hardware". In the preferred embodiment of the present invention, the Simulated Hardware 202 is a multi-processor system such as the Risc System/6000 [TM] J30 produced by International Business Machines.

It should be noted, however, that the teachings of the present invention are not limited to verifying instruction completion solely for a multi-processor system, but are equally applicable to any type of system that issues instructions that impact the coherency of its memory.

With continuing reference to FIG. 2, two First In/First Out queues Load Pending 206 and Store Pending 204 are shown and used by the present invention for coloring and verifying the completion of load and store instructions, respectively, which are issued from the Simulated Hardware 202. The mechanism for controlling the coloring and verification is the Verification Logic Unit 204. The Verification Logic Unit 204 monitors the occurrence of Load/Store instructions issued from the Simulated Hardware 202. Operations involving data are executed by the Central Processing Unit via Registers. In general, the registers of the CPU are used for storing data temporarily or for representing the physical location in which the data is stored.

Hereinafter, the terminology of "Target" refers to either the register in which designated data will be loaded (load instruction) or the physical location in which the data is stored (store instruction). For example, in the following instructions "Load A, [B]" and "Store A, [B]", register A is the Target for the load instruction, and register B indicates the Target for the store instruction.

Figure 3:
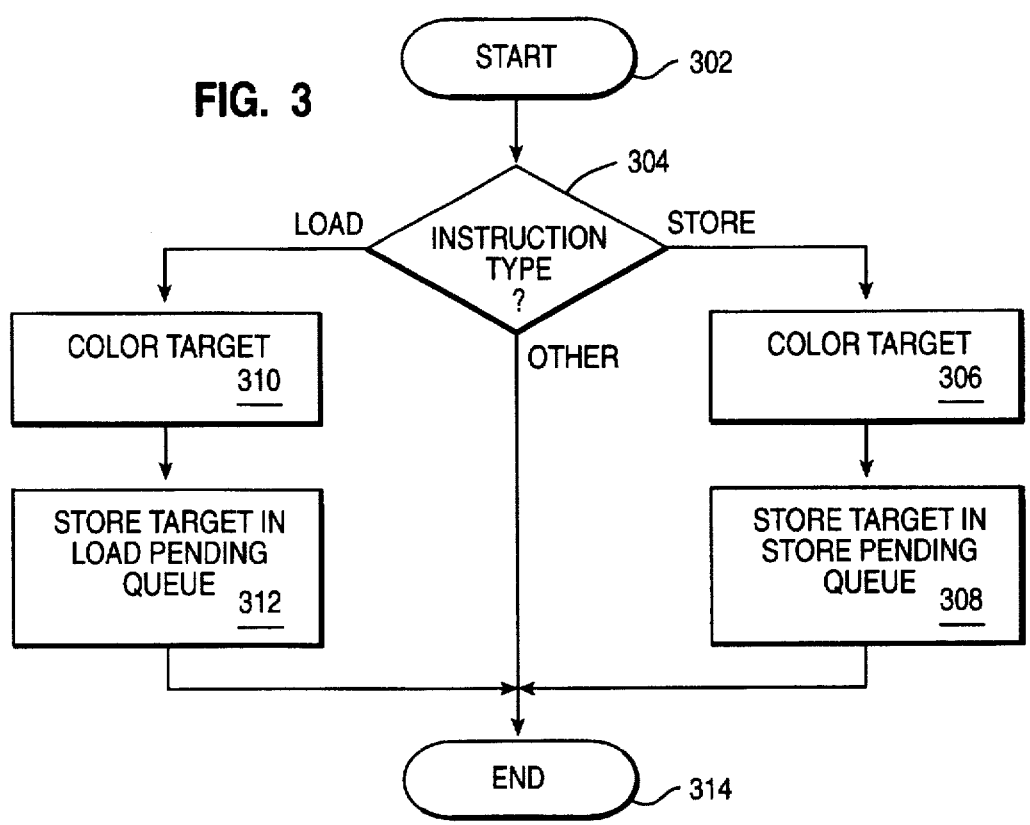
FIG. 3 is a flow chart illustrating the steps comprising the method used by the Verification Logic Unit of FIG. 2 upon the detection of a Load or a Store instruction issuing from the Simulated Hardware of FIG. 2 according to the teachings of the present invention.

Reference now being made to FIG. 3, a flow chart is shown illustrating the steps comprising the method used by the Verification Logic Unit 204 upon the detection of a Load or a Store instruction issuing from the Simulated Hardware 202 of FIG. 2 according to the teachings of the present invention. The method begins at step 302 upon the detection of an instruction issued by the Simulated Hardware 202, and proceeds to step 304 where it is determined whether or not the instruction was a Load, Store, or Other. If, at step 304, it is determined that the detected instruction was a load instruction, then the method proceeds to step 310 where the Target (Register) for the load instruction is Colored. The term Colored, as used hereinafter, refers to a value used to indicate with certainty that the instruction associated with the Target has not been executed, and once the instruction has been executed the new value is distinguishable from the color value. Consequently, any such value chosen must be restricted solely for use by the Verification Logic Unit 204 for such coloring. In the preferred embodiment of the present invention, the color value is the maximum value of Registers 102b (FFFFh).

Thereafter, the method proceeds to step 312 where the Target (Register) is stored in the Load Pending Queue 206, and the method proceeds to end at step 314. If, however, it is determined, at step 304, that the detected instruction is a store instruction, then the method proceeds to step 306 where the Target (memory location) of the store instruction is Colored. Thereafter, the method proceeds to step 308 where Target (representation of the location) is stored in the Store Pending Queue 208, and the method proceeds to end at step 314.

If, at step 304, it is determined that the detected instruction is neither a store nor a load, then the method proceeds to end at step 314.

Figure 4:
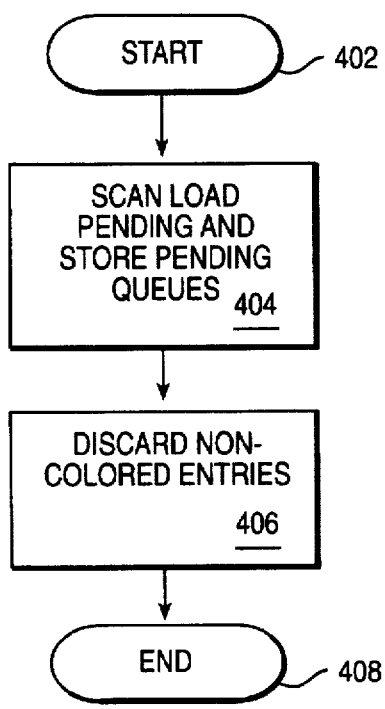
FIG.4 is a flow chart comprising the steps executed by the Verification Logic Unit of FIG. 2 during every clock cycle of the Computer System 100 of FIG. 1 according to the teachings of the present invention.

Reference now being made to FIG. 4, a flow chart is shown comprising the steps executed by the Verification Logic Unit 204 of FIG. 2 during every clock cycle of the Data Processing System 100 of FIG. 1 according to the teachings of the present invention. The method begins at step 402 upon the beginning of a new clock cycle, and proceeds to step 404 where the Load Pending 206 and Store Pending 204 queues are scanned for any Targets which are no longer colored (no longer have the unique value assigned for marking). Thereafter, the method proceeds to step 406 where any entries having Target Registers which are not colored are discarded from the corresponding queue 206 or 204, and the method proceeds to end at step 408.

Upon the completion of the execution of the Simulated Hardware 202, any entries remaining in either the Load Pending 206 or Store Pending 208 Queues indicate an error in the logic of the Simulated Hardware 202 has occurred. Thus, alerting the system designer to a potential problem therewith. Attached hereto as Appendix A is an example of a state table representation of the Verification Logic Unit 204 and corresponding pseudo code therefore.

It is thus believed that the operation and construction of the present invention will be apparent from the foregoing description. While the method and system shown and described has been characterized as being preferred, it will be readily apparent that various changes and/or modifications could be made wherein without departing from the spirit and scope of the present invention as defined in the following claims.

TABLE 1

Input states actions for detecting store completion

Notation:
a− = Previous mesi state associated with the address was invalid
a = Current mesi sate of the same address is invalid
b− = Previous mesi state associated with the address was shared/exclusive
b = Current mesi state of the same address is shared/exclusive
c− = Previous mesi state associated with the address was modified
c = Current mesi state of the same address is modified
d = Any store to same sector, but different byte pending
e = Any store to the same byte issued before, but not finished
f = Any load from the same byte issued before, but not finished Since an address is bound to an instruction we have a state machine model associated with each address corresponding to the instruction. The state machine and the actions are described in Table 1. The functions that govern the actions are also provided in sections below.

| a− | a | b− | c− | b | c | d | e | f | actions and next state of "def" | Output |
|----|---|----|----|---|---|---|---|---|-------------------------------|--------|
| 0  | 1 | x  | x  | 0 | 1 | 0 | 0 | 0 |                               | Store Complete |
|    |   |    |    |   |   | 0 | 0 | 1 |                               | Error! |
|    |   |    |    |   |   | 0 | 1 | 0 | foo1( )                       | None |
|    |   |    |    |   |   | 0 | 1 | 1 | foo1( )                       | None |
|    |   |    |    |   |   | 1 | 0 | 0 | foo2( )                       | msg from foo2 |

TABLE 1-continued

Input states actions for detecting store completion

| | | | | | | | | | | |
|---|---|---|---|---|---|---|---|---|---|---|
| | | | | | | 1 | 0 | 1 | foo2( ) | msg from foo2 |
| | | | | | | 1 | 1 | 0 | foo3( ) | msg from foo3 |
| | | | | | | 1 | 1 | 1 | foo3( ) | msg from foo3 |
| 0 | 1 | x | x | 1 | 0 | 0 | 0 | 0 | | Error! |
| | | | | | | 0 | 0 | 1 | foo4( ) | None |
| | | | | | | 0 | 1 | 0 | | Error! |
| | | | | | | 0 | 1 | 1 | foo4( ) | None |
| | | | | | | 1 | 0 | 0 | | Error! |
| | | | | | | 1 | 0 | 1 | foo4( ) | None |
| | | | | | | 1 | 1 | 1 | | Error! |
| 1 | 1 | 0 | 1 | 0 | 1 | 0 | 0 | 0 | if cac_data != F...F<br>else | Store Completed<br>None |
| | | | | | | 0 | 0 | 1 | foo5( ) | None |
| | | | | | | 0 | 1 | 0 | foo6( ) | None |
| | | | | | | 0 | 1 | 1 | foo5( ) & foo6( ) | None |
| | | | | | | 1 | 0 | 0 | if cac_data != F...F<br>else<br>foo7( ) | Store Completed<br><br>None |
| | | | | | | 1 | 0 | 1 | foo5( ) & foo7( ) | None |
| | | | | | | 1 | 1 | 0 | foo6( ) & foo7( ) | None |
| | | | | | | 1 | 1 | 1 | foo5( ) & foo6( ) & foo7( ) | None |
| 1 | 1 | 1 | 0 | 0 | 1 | 0 | 0 | 0 | | Store Completed |
| | | | | | | 0 | 0 | 1 | | Error! |
| | | | | | | 0 | 1 | 0 | e = 0, set cac_data = F...F | None |
| | | | | | | 0 | 1 | 1 | e = 0 | None |
| | | | | | | 1 | 0 | 0 | foo2( ) | msg from foo2 |
| | | | | | | 1 | 0 | 1 | foo2( ) | msg from foo2 |
| | | | | | | 1 | 1 | 0 | foo3( ) | msg from foo3 |
| | | | | | | 1 | 1 | 1 | foo3( ) | msg from foo3 |
| 1 | 1 | 0 | 1 | 1 | 0 | 0 | 0 | 0 | same | None |
| | | | | | | 0 | 0 | 1 | foo4( ) | None |
| | | | | | | 0 | 1 | 0 | same | None |
| | | | | | | 0 | 1 | 1 | foo4( ) | None |
| | | | | | | 1 | 0 | 0 | same | None |
| | | | | | | 1 | 0 | 1 | foo4( ) | None |
| | | | | | | 1 | 1 | 0 | same | None |
| | | | | | | 1 | 1 | 1 | foo4( ) | None |
| 1 | 1 | 1 | 0 | 1 | 0 | 0 | 0 | 0 | same | None |
| | | | | | | 0 | 0 | 1 | foo4( ) | None |
| | | | | | | 0 | 1 | 0 | same | None |
| | | | | | | 0 | 1 | 1 | foo4( ) | None |
| | | | | | | 1 | 0 | 0 | same | None |
| | | | | | | 1 | 0 | 1 | foo4( ) | None |
| | | | | | | 1 | 1 | 0 | same | None |
| | | | | | | 1 | 1 | 1 | foo4( ) | None |

Pseudo Codes: (A) function foo1( ): check if all previous stores to same addr completed
when d = 0 e = 1 a-- = 0 a = 1 c = 1
Input : addrxxx - addr for this store
        store_wait_queue
f - current state value of f
Output : e - next state value of e
Code:
if only one store to same addr pending
    e = 0
    if f = 0
        set cac_data = FFF...F
    else
        e = 1
(B) function foo2( ): check to see whether this store or other store
In the same sector completed, when d = 1 e = 0 c-- = 0 c = 1
If this store not complete, set cac_data = FFF_F
Input: addrxxx - addr for this store
       store_wait_queue
Output : message - message for output
     d - next state value of d
Code:
Read cache_in_buffer
for addrxxx, if cac_data != cac_bug_data
    message = "Store Completed"
   else
       set cac_data = FFF...F
       if only one other store pending in the same sector
           d = 0
       else
           d = 1
(C) function foo3( ): check to see which store in the sector completed TABLE 1-continued Input states actions for detecting store completion

```
              when d = 1 e = 1 c- = 0 c = 1
   Input : addrxxx - addr for this store
           store_wait_queue
   Output : d - next state value of d
            e - next sate value of e
   Code:
   Read cache_in_buffer
       for addrxxx, if cac_data != cac_buf_data
           if only one store to same address before this one
               e = 0, d = 1
               set cac_data = FFF . . . F
                   else
               e = 1, d = 1
           else
       if only one other store pending in the same sector
           d = 0, e = 1
       else
           d = 1, e = 1
(D) function foo4( ): check if pending load to same addr completed
              when e = 1, b = 1
   Input : addrxxx - addr for this store
           load_wait_queue
   Output : f - next state value of f
   Code:
   Go through load_wait_queue
       if all loads(from addrxxx) issued before store completed
           f = 0
       else
           f = 1
(E) function foo5( ): check if pending load to same addr completed
              when e = 1, c- = 1, c = 1
   Input : addrxxx - addr for this store
           load_wait_queue
   Output : f - next state value of f
   Code:
   Go through load_wait_queue
       if all loads(from addrxxx) issued before store completed
           f = 0
               set cac_data = FFF . . . F
           else
               f = 1
(F) function foo6( ): check if previous store to same addr completed
              when d = 0 e = 1 c- = 1 c = 1
   Input : addrxxx - addr for this store
           store_wait_queue
   Output : e - next state value of e
   Code:
           Read cache_in_buffer
               for addrxxx, if cac_data != FFF . . . FF
           if only pending store to same addr
               e = 0
               set cac_data = FFF . . . F
           else
               e = 1
(G) function foo7( ): check if all other stores to same sector completed
   Input : addrxxx - addr for this store
           store_wait_queue
   Output : d - next state value of d
   Code:
   if only one other store in the sector
       if (for the other store addr) cac_data != FFF . . . F
           d = 0
       else
           d = 1
© copyright 1995 IBM
```

What is claimed is:

1. In a first data processing system simulating the execution of a second data processing system, a method of verifying simulated memory coherency for the second data processing system, the method comprising the steps of:

detecting, with said first data processing system, load and store instructions issued from said second data processing system, each one of the load and store instructions having a target location for receiving data;

initializing each one of the target locations to equal an initialization value;

storing each one of the target locations corresponding to a store instruction in a store queue; and storing each one of the target locations corresponding to a load instruction in a load queue;

storing a new value in each one of the target locations in response to executing the corresponding instruction; and detecting, after the simulation is complete, any of the target locations having an initialization value.

2. The method of claim 1 further comprising the steps of:

monitoring, during said simulation, said load and store queues for any target locations having a new value; and removing the detected target locations from said store and load queues.

3. The method of claim 2 wherein said step of detecting, after said simulation is complete, includes the step of:

scanning said store and load queues for any target locations having an initialization value.

4. An apparatus for simulating a data processing system and for verifying simulated memory coherency for said data processing system, said apparatus comprising:

means for detecting, with said first data processing system, load and store instructions issued from said second data processing system, each one of the load and store instructions having a target location for receiving data;

means for initializing each one of the target locations to equal an initialization value;

means for storing each one of the target locations corresponding to a store instruction in a store queue; and means for storing each one of the target locations corresponding to a load instruction in a load queue;

means for storing a new value in each one of the target locations in response to executing the corresponding instruction; and means for detecting, after the simulation is complete, any of the target locations having an initialization value.

5. The apparatus of claim 4 further comprising:

means for monitoring, during said simulation, said load and store queues for any target locations having a new value; and means for removing the detected target locations from said store and load queues.

6. The apparatus of claim 5 wherein said means for detecting, after said simulation is complete, includes:

means for scanning said store and load queues for any target locations having an initialization value.

7. A computer program product comprising:

a computer usable medium having computer readable program code means embodied in said medium for verifying memory coherency of a first data processing system being simulated by a second data processing system, said computer readable program code means including:

means for detecting, with said first data processing system, load and store instructions issued from said second data processing system, each one of the load and store instructions having a target location for receiving data;

means for initializing each one of the target locations to equal an initialization value;

means for storing each one of the target locations corresponding to a store instruction in a load queue;

means for storing each one of the target locations corresponding to a load instruction in a load queue;

means for storing a new value in each one of the target locations in response to executing the corresponding instruction; and means for detecting, after the simulation is complete, any of the target locations having an initialized value.

8. The computer program product of claim 7 wherein said computer readable program code means further comprises:

means for monitoring, during said simulation, said load and store queues for any target locations having a new value; and means for removing the detected target locations from said store and load queues.

9. The computer program product of claim 8 wherein said means for detecting, after said simulation is complete, includes:

means for scanning said store and load queues for any target locations having an initialization value.

* * * * *